United States Patent

Sato et al.

[11] Patent Number: 5,939,510
[45] Date of Patent: Aug. 17, 1999

[54] UNDERCOATING COMPOSITION FOR PHOTOLITHOGRAPHIC RESIST

[75] Inventors: Mitsuru Sato, Kanagawa-ken; Katsumi Oomori, Yokohama; Etsuko Iguchi, Machida; Kiyoshi Ishikawa, Kanagawa-ken; Fumitake Kaneko, Hiratsuka, all of Japan

[73] Assignee: Tokyo Ohka Kogya Co., Ltd., Japan

[21] Appl. No.: 08/845,358

[22] Filed: Apr. 24, 1997

[30] Foreign Application Priority Data

Apr. 25, 1996 [JP] Japan .................................. 8-105921

[51] Int. Cl.⁶ .............................. G03F 7/11; C08G 8/02; C08G 12/00
[52] U.S. Cl. .................... 528/128; 528/227; 528/228; 528/229; 430/522; 430/271.1
[58] Field of Search ..................... 528/128, 227, 528/228, 229; 522/905; 430/522, 159, 166, 155, 271.1

[56] References Cited

U.S. PATENT DOCUMENTS

| | | | |
|---|---|---|---|
| 4,197,392 | 4/1980 | Moore | 528/127 |
| 4,910,122 | 3/1990 | Arnold et al. | 430/313 |
| 5,234,990 | 8/1993 | Flaim et al. | 524/609 |
| 5,294,680 | 3/1994 | Knors et al. | 525/327.4 |
| 5,478,692 | 12/1995 | Doi et al. | 430/191 |
| 5,498,514 | 3/1996 | Nakao et al. | 430/512 |
| 5,599,653 | 2/1997 | Nakao et al. | 430/314 |

FOREIGN PATENT DOCUMENTS

| | | |
|---|---|---|
| 0314037 | 5/1989 | European Pat. Off. . |
| 0542008 | 5/1993 | European Pat. Off. . |
| 8-87115 | 4/1996 | Japan . |
| 1052529 A | 11/1983 | U.S.S.R. . |

OTHER PUBLICATIONS

Gurevich et al., 100: 140880, English Abstract of SU 1052529 A1, Chemical Abstracts, ASC, 1998.
Gurevich et al. 84–176028 English Abstract of SU 1052529 A Dated Nov. 7, 1983, WPIDS, Derevent Limited, 1998.
RN 90–94–8, Registry, ACS, 1998.
RN 108231–46–5, Registry, ACS, 1998.
Daehre et al., Plaste und Kautschuk, 33, Jahrgang Heft Nov. 1986, pp. 431–436, 1986.
Daehre et al., 106: 196890, Chemical Abstracts online, ACS, 1998.
*Patent Abstracts of Japan*, vol. 010, No. 075 (E–390).

*Primary Examiner*—Cynthia Hamilton
*Attorney, Agent, or Firm*—Wenderoth, Lind & Ponack, L.L.P.

[57] ABSTRACT

Proposed is a novel undercoating composition to form an undercoating layer interposed between the surface of a substrate and a photoresist layer with an object to decrease the adverse influences by the reflection of light on the substrate surface in the pattern-wise exposure of the photoresist layer to ultraviolet light without the undesirable phenomena of intermixing between layers and notching along with a large selectivity ratio in the etching rates between the patterned resist layer and the undercoating layer in a dryetching treatment. The undercoating composition comprises (A) an ultraviolet absorber which is a benzophenone compound or an aromatic azomethine compound each having at least one unsubstituted or alkyl-substituted amino group on the aryl groups and (B) a crosslinking agent which is preferably a melamine compound having at least two methylol groups or alkoxymethyl groups bonded to the nitrogen atoms in a molecule in a weight proportion (A):(B) in the range from 1:1 to 1:10.

6 Claims, No Drawings

UNDERCOATING COMPOSITION FOR PHOTOLITHOGRAPHIC RESIST

BACKGROUND OF THE INVENTION

The present invention relates to a novel undercoating composition for photolithographic resist layer and a photolithographic patterning resist material by using the undercoating composition. More particularly, the subject matter of the invention is a coating composition for forming an undercoating layer on a substrate surface to be interposed between the substrate surface and a photolithographic resist layer for patterning without the problems of notching or intermixing between the undercoating layer and the photoresist layer thereon and capable of exhibiting a high suppressing effect on the reflection of light from the substrate surface and giving a patterned resist layer having high fidelity to the photomask pattern along with a high selectivity ratio in etching of the undercoating layer as well as a photolithographic resist material for patterning consisting of a substrate and a photoresist layer with intervention of an undercoating layer formed from the undercoating composition.

Along with the trend in recent years in the photolithographic patterning technology for the manufacture of semiconductor devices toward a shorter and shorter wavelength of the light for pattern-wise exposure of a photoresist layer, the patterning work is performed by using the i-line light of 365 nm wavelength, deep ultraviolet light and excimer laser beams as the major current. The pattern-wise exposure of the photoresist by using such a short wavelength light is accompanied by the problem of an increase in the reflection of the light on the substrate surface resulting in the degradation of the quality of the patterned resist layer such as local distortion of the pattern or so-called notching and decrease in the dimensional accuracy of the reproduced pattern. With an object to suppress these disadvantageous phenomena, technological interest is now directed to the so-called ARC (anti-reflective coating) method in which an anti-reflective layer is interposed between the substrate surface and the photoresist layer. Various attempts and proposals have been made heretofore on an undercoating composition for the formation of the anti-reflective undercoating layer for the photoresist layer.

For example, Japanese Patent Kokai 59-93448 discloses a photoresist material in which an anti-reflective undercoating layer containing an ultraviolet absorber is interposed between the substrate surface and the photoresist layer. Since the undercoating composition for the anti-reflective undercoating layer contains a polyamine acid and polybutene sulfonic acid as the resinous ingredient, the adhesion between the anti-reflective coating layer and the substrate surface or photoresist layer is relatively poor resulting in some troubles such as exfoliation of the layers in the lapse of time and formation of scum in the course of the development treatment.

With an object to solve the above described problems, the inventors in Japanese Patent Kokai 6-35201 have proposed an undercoating composition for anti-reflection in photolithography containing a copolymer of glycidyl methacrylate and methyl methacrylate as the resinous ingredient and an ultraviolet absorber. Due to the low compatibility between the ultraviolet absorber and the resinous ingredient, however, the undercoating composition has a limitation in the content of the ultraviolet absorber so that, when the amount of the ultraviolet absorber is in excess of the upper limit, the anti-reflective effect of the undercoating layer cannot be fully exhibited due to intermixing between the undercoating layer and the photoresist layer formed thereon and, in addition, the dimensional fidelity of the patterned resist layer to the photomask pattern cannot be high enough and cannot fully comply with the requirement in the fine and precision patterning in the modern technology for the manufacture of semiconductor devices. While it is desirable in order to accomplish improvements in the working efficiency and fidelity of the patterned photoresist layer to the photomask pattern that the ratio between the etching rate of the undercoating layer and the etching rate of the photoresist layer in the etching treatment to follow patterning of the resist layer or the so-called selectivity ratio should be as high as possible, the above proposed undercoating composition is not quite satisfactory in this regard because the selectivity ratio cannot be high enough with the undercoating composition.

SUMMARY OF THE INVENTION

The present invention accordingly has an object, in view of the above described problems, to provide a novel and improved undercoating composition for photolithographic resist capable of giving an undercoating layer which fully suppresses reflection of the exposure light from the substrate surface without the troubles due to intermixing and notching with the photoresist layer thereon so as to give a patterned resist layer having high fidelity to the photomask pattern along with a high selectivity ratio in etching as well as to provide a resist material for photolithographic patterning by the use of the undercoating composition.

Thus, the undercoating composition for photolithographic resist provided by the invention comprises, as a uniform solution in an organic solvent:

(A) an ultraviolet absorber selected from the group consisting of (A1) benzophenone compounds having at least one amino group or an alkyl-substituted amino group in a molecule represented by the general formula

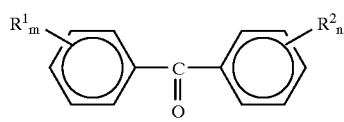

(I)

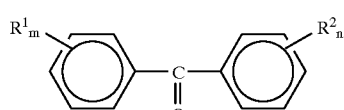

(I)

in which the subscripts m and n are, each independently from the other, 1 or 2 and $R^1$ and $R^2$ denote, each independently from the others, an amino group, alkyl-substituted amino group or hydroxyl group, at least one of the groups denoted by $R^1$ and $R^2$ in a molecule being an amino group or alkyl-substituted amino group, (A2) aromatic azomethine compounds represented by the general formula $$A^1\text{---CH}\!=\!\!N\text{---}A^2, \quad (II)$$

in which $A^1$ and $A^2$ denote, each independently from the other, an aryl group having a substituent selected from the group consisting of an amino group, alkyl-substituted amino group, hydroxyl group, nitro group, halogen atom, alkyl group and alkoxy group, at least either one of $A^1$ and $A^2$ in a molecule being an aryl group substituted by an amino group or alkyl-substituted amino group, and (A3) (tere)phthalic acid diester compounds represented by the general formula (III)

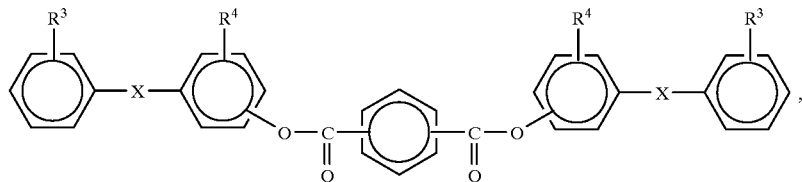

in which each of the groups $R^3$ and $R^4$ denotes, independently from the others, a group selected from the group consisting of an amino group, alkyl-substituted amino groups, hydroxyl group, nitro group, halogen atoms, alkyl groups and alkoxy groups, of which at least one is an amino group or an alkyl-substituted amino group, and each X denotes an azomethine linkage of the formula —CH=N— or —N=CH—; and (B) a crosslinking agent which is a nitrogen-containing organic compound having at least two groups selected from the group consisting of hydroxyalkyl groups and alkoxyalkyl groups, in a weight proportion of the component (A) to the component (B) in the range from 1:1 to 1:10.

Further, the resist material of the invention for photolithographic patterning is an integral layered body which comprises:

(a) a substrate;

(b) an undercoating layer formed on one of the surfaces of the substrate from the undercoating composition defined above; and (c) a photoresist layer of a photosensitive composition formed on the surface of the undercoating layer.

DETAILED DESCRIPTION OF THE PREFERRED EMBODIMENTS

As is described above, the undercoating composition of the present invention comprises, as the essential ingredients, a specific ultraviolet absorber compound as the component (A) and a specific crosslinking agent as the component (B) in a specified weight proportion.

The ultraviolet absorber as the component (A) is selected from three classes of aromatic compounds including (A1) benzophenone compounds having at least one amino or alkyl-substituted amino group in a molecule, (A2) azomethine compounds having two aryl groups bonded to the azomethine carbon and nitrogen atoms in the molecule, of which at least either one is substituted by an amino or alkyl-substituted amino group and a compound (A3) having two azomethine linkages in a molecule as represented by the general formula (III). The ultraviolet absorber compounds belonging to the classes (A1) to (A3) can be used either singly or as a combination of two or more different compounds belonging to the same class or to different classes. The compounds as the component (A) have a common characteristic feature that a molecule thereof has at least one amino group or an alkyl-substituted amino group having an activity to promote the crosslinking reaction of the component (B) as a crosslinking agent.

The benzophenone compound belonging to the class (A1) of the ultraviolet absorbers is represented by the above given general formula (I), in which the subscripts m and n are each a number of 1 or 2 and the groups denoted by $R^1$ or $R^2$ are each, independently from the others, a hydroxyl group, amino group or alkyl-substituted amino group. The alkyl-substituted amino group include monoalkylamino groups and dialkylamino groups exemplified by methylamino, dimethylamino, ethylamino, diethylamino, n-propylamino, di-n-propylamino, isopropylamino and diisopropylamino groups, of which preferable are the dialkylamino groups and more preferable are the amino groups substituted by two alkyl groups each having 1 to 4 carbon atoms. The groups denoted by $R^1$ and $R^2$ in a molecule can be selected each independently from the others with the proviso that at least one of them in a molecule is an unsubstituted or alkyl-substituted amino group. When the subscript m or n is 2, the two of the groups $R^1$ or $R^2$, respectively, can be the same or can be different each from the other.

Examples of the benzophenone compounds suitable as the component (A1) in the inventive undercoating composition include: 2-hydroxy-4'-dimethylamino benzophenone having a gram absorption coefficient at a wavelength of 365 nm, referred to simply as ε hereinafter, of 78.9; 2,4-dihydroxy-4'-dimethylamino benzophenone having ε of 96.2; 2,4-dihydroxy-4'-diethylamino benzophenone having ε of 87.3; 4,4'-bis(diethylamino) benzophenone having ε of 102.8; 4,4'-bis(dimethylamino) benzophenone having ε of 95.0 and the like, of which 4,4'-bis(diethylamino) benzophenone is preferred in respect of the large absorption coefficient of light to exhibit an excellent anti-reflective effect.

The ultraviolet absorber belonging to the second class (A2) is selected from the aromatic azomethine compounds represented by the above given general formula (II), in which each of the groups denoted by $A^1$ and $A^2$ is an aryl group substituted by an amino group, alkyl-substituted amino group, hydroxyl group, nitro group, halogen atom, alkyl group or alkoxy group. It is essential that at least either one of the groups denoted by $A^1$ and $A^2$ in a molecule is an aryl group substituted by an unsubstituted or alkyl-substituted amino group.

The alkyl-substituted amino group substituting the aryl group in the general formula (II) include monoalkylamino groups and dialkylamino groups exemplified by methylamino, dimethylamino, ethylamino, diethylamino, n-propylamino, di-n-propylamino, isopropylamino and diisopropylamino groups, of which preferable are the dialkylamino groups and more preferable are the amino groups substituted by two alkyl groups each having 1 to 4 carbon atoms. The halogen atom as the substituent of the aryl groups is exemplified by the atoms of fluorine, chlorine, bromine and iodine. The alkyl group as the substituent of the aryl groups is exemplified by those having 1 to 4 carbon atoms such as methyl, ethyl, n-propyl and isopropyl groups. The alkoxy group as the substituent of the aryl groups is exemplified by those having 1 to 4 carbon atoms such as methoxy, ethoxy, n-propoxy and isopropoxy groups. The aryl group to be substituted by the above named substituents is preferably a phenyl or naphthyl group.

Examples of the aromatic azomethine compounds suitable as the ultraviolet absorber of the class (A2) include: 3-hydroxy-N-(4-diethylaminobenzylidene) aniline; 2-hydroxy-N-(4-diethylaminobenzylidene) aniline; 4-hydroxy-N-(4-diethylaminobenzylidene) aniline; 4-hydroxy-N-(4-diethylaminobenzylidene)-1-naphthylamine; 2-hydroxy-5-chloro-N-(4-diethylaminobenzylidene) aniline; 2,4-dihydroxy-N-(4-diethylaminobenzylidene) aniline; 3-nitro-4-hydroxy-N-(4-diethylaminobenzylidene) aniline having ϵ of 115.2; 2-methyl-4-hydroxy-N-(4-diethylaminobenzylidene) aniline; 3-hydroxy-4-methoxy-N-(4-diethylaminobenzylidene) aniline having ϵ of 102.0; 4-diethylamino-N-(3-hydroxy-4-methoxybenzylidene) aniline; and the like, of which 3-nitro-4-hydroxy-N-(4-diethylaminobenzylidene) aniline having a relatively large absorption coefficient is preferred in respect of the high anti-reflective effect obtained therewith.

The third class (A3) of the ultraviolet absorber as the component (A) in the inventive undercoating composition includes those compounds having a structure of a diester of phthalic or terephthalic acid as represented by the above given general formula (III).

The alkyl-substituted amino group as a substituent of $R^3$ or $R^4$ include monoalkylamino groups and dialkylamino groups exemplified by methylamino, dimethylamino, ethylamino, diethylamino, n-propylamino, di-n-propylamino, isopropylamino and diisopropylamino groups, of which preferable are the dialkylamino groups and more preferable are the amino groups substituted by two alkyl groups each having 1 to 4 carbon atoms. The halogen atom as the substituent of the aryl groups is exemplified by the atoms of fluorine, chlorine, bromine and iodine. The alkyl group as the substituent of the aryl groups is exemplified by those having 1 to 4 carbon atoms such as methyl, ethyl, n-propyl and isopropyl groups. The alkoxy group as the substituent of the aryl groups is exemplified by those having 1 to 4 carbon atoms such as methoxy, ethoxy, n-propoxy and isopropoxy groups.

Examples of the aromatic azomethine compounds represented by the general formula (III) include those compounds as a diester of terephthalic acid or phthalic acid having two azomethine linkages in a molecule expressed by the following structural formulas:

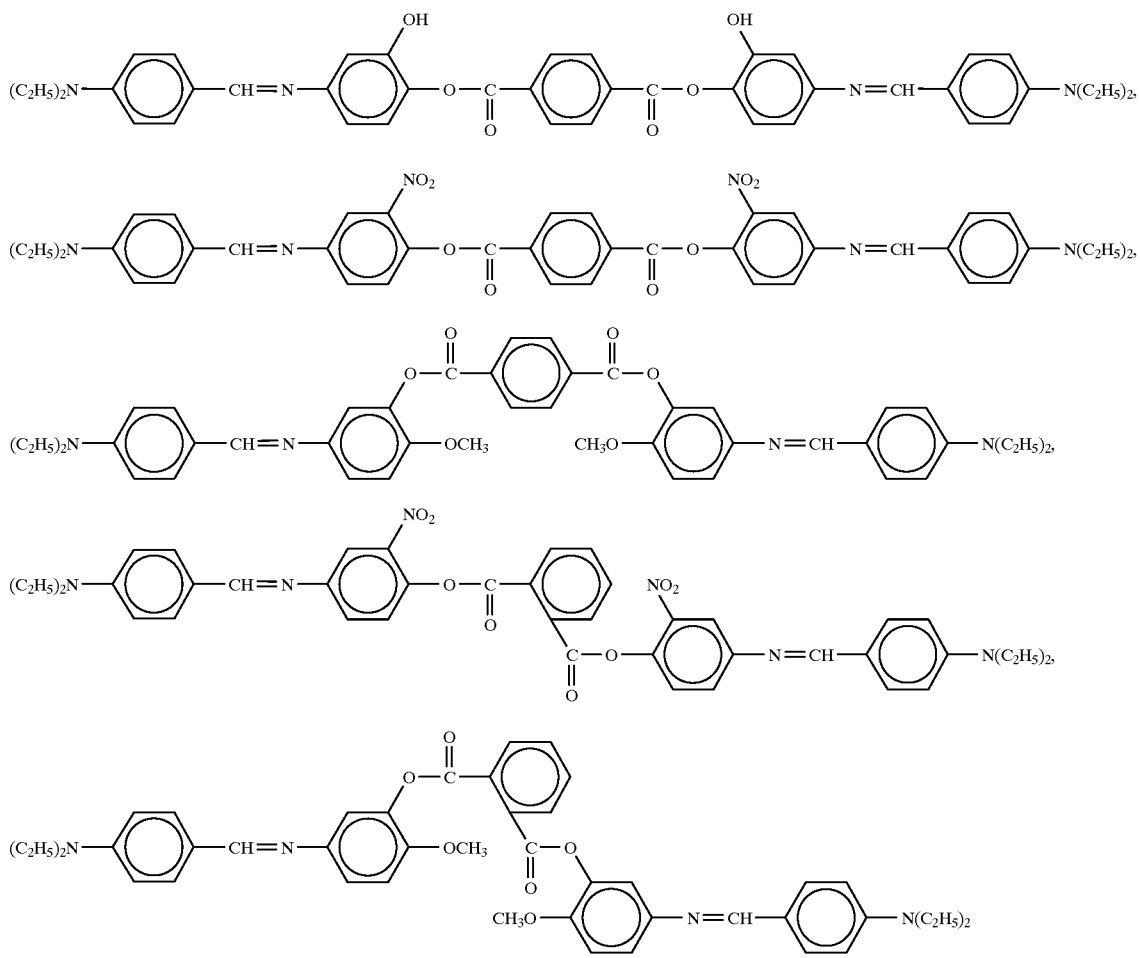

and

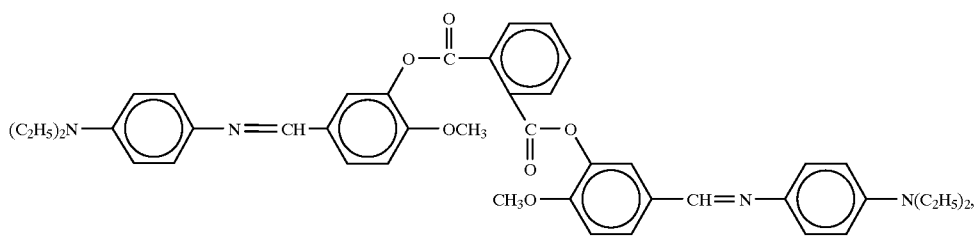

of which the derivatives of phthalic acid are preferable in respect of the good solubility in organic solvents. The azomethine compounds represented by the general formula (III) having two azomethine linkages in a molecule are advantageous as compared with the compounds having a single azomethine linkage in a molecule belonging to the class (A2) because of the lower sublimability not to be lost in the course of formation of an undercoating layer from the inventive undercoating composition involving a heat treatment.

The component (B) to be combined with the above described component (A) in the inventive undercoating composition is a nitrogen-containing organic compound having at least two groups selected from the group consisting of hydroxyalkyl group and alkoxyalkyl groups or, preferably, a nitrogen-containing organic compound having at least two amino groups substituted each by one or two functional groups selected from the class consisting of hydroxyalkyl groups and alkoxyalkyl groups to serve as a crosslinking agent.

Examples of such a nitrogen-containing organic compound include melamine, urea, guanamine, acetoguanamine, benzoguanamine, glycoluryl, succinylamide and ethylene urea substituted for the hydrogen atoms of the amino group by methylol groups, alkoxymethyl groups or a combination thereof. Such a substituted nitrogen-containing compound can be prepared by subjecting the starting nitrogen-containing compound, i.e. melamine, urea and the like, to a methylolation reaction with formaldehyde in boiling water followed, if desired, by alkoxylation of the methylol groups by the reaction with a lower alcohol such as methyl, ethyl, n-propyl and isopropyl alcohols. These substituted nitrogen-containing organic compounds as the component (B) can be used either singly or as a combination of two kinds or more according to need.

Among the above described substituted nitrogen-containing compounds, preferable are the melamine compounds represented by the general formula

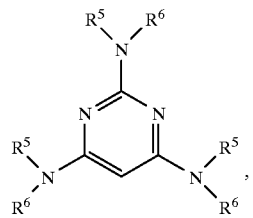

in which each of the six groups denoted by $R^5$ and $R^6$ is a hydrogen atom, methylol group or alkoxymethyl group with the proviso that at least two of the six groups are methylol or alkoxymethyl groups, in respect of the good crosslinkability. It is preferable that the melamine compound, which may be in the form of a dimer or trimer, has at least 3 but less than 6 of the methylol groups and/or alkoxymethyl groups per melamine ring.

Several grades of commercial products of melamine compounds are available on the market to meet the above described requirements including Mx-750 and Mw-30 (each a product by Sanwa Chemical Co.) of which the number of substituting methoxymethyl groups is 3.7 or 5.8, respectively, on an average per melamine ring.

The weight ratio of the component (A) to the component (B) in the inventive undercoating composition is in the range from 1:1 to 1:10 or, preferably, in the range from 1:1.2 to 1:3.5 in respect of obtaining a good balance between the anti-reflective effect and other properties of the undercoating layer. When the amount of the component (A) relative to the component (B) is too small, the desired anti-reflective effect cannot be fully exhibited while, when the amount of the component (A) is too large, adverse influences are caused on the properties of the undercoating layer of the composition other than the anti-reflective effect.

It is of course optional according to need that the inventive undercoating composition is admixed with a crosslinking promoter having compatibility to accelerate the crosslinking reaction in the component (B). Suitable crosslinking promoter includes 2,2',4,4'-tetrahydroxybenzophenone and carboxylic acids such as acetic acid, oxalic acid, maleic acid, o-hydroxybenzoic acid, 3,5-dihydroxybenzoic acid and 2,6-dihydroxybenzoic acid as well as carboxyl group-containing polymeric compounds such as SAX (a commercial product by Mitsui Toatsu Chemical Co.) which is a copolymer consisting of an o-hydroxybenzoic acid moiety and p-xylylene moiety, of which 2,2',4,4'-tetrahydroxy benzophenone is preferred because this compound also acts as an ultraviolet absorber so that the overall anti-reflective effect can be further increased so much. The amount of the crosslinking promoter, when added, should not exceed 80% by weight relative to the overall content of the non-volatile matter in the undercoating composition.

Since the undercoating layer of the inventive undercoating composition pattern-wise exposed bare after patterning of the photoresist layer thereon usually has to be removed by etching with an etching gas, another important requirement for the undercoating layer is that the selectivity ratio relative to the etching rates of the undercoating layer and the resist layer is as high as possible although the selectivity ratio largely depends on the types of the etching gas and the thickness of the undercoating layer. In this regard, the selectivity ratio of the undercoating layer can be controlled, if necessary, by the admixture of the undercoating composition with an acrylic resin.

Suitable acrylic resins used for the above mentioned purpose include those (co)polymers obtained by the polymerization of one or more of (meth)acrylate ester monomers, e.g., glycidyl (meth)acrylate, methyl (meth) acrylate, ethyl (meth)acrylate, propyl (meth)acrylate and the like, such as polyglycidyl (meth)acrylate, polymethyl (meth) acrylate, polyethyl (meth)acrylate, copolymers of glycidyl (meth)acrylate and methyl methacrylate and the like having a weight-average molecular weight in the range from 10,000 to 200,000 or, preferably, from 20,000 to 100,000. The term of (meth)acrylate above is given for acrylate, methacrylate or a combination thereof. A particularly preferable acrylic resin is a copolymer of glycidyl methacrylate and methyl methacrylate in a weight ratio from 2:8 to 8:2 or, more preferably, from 3:7 to 7:3 in respects of less occurrence of intermixing between the undercoating layer and the photoresist layer thereon and high selectivity ratio between the layers. The amount of such an acrylic resin, if added, should not exceed 40% by weight based on the overall content of non-volatile matter in the undercoating composition.

Further, it is optional that the undercoating composition of the invention is admixed with a surface active agent with an object to improve the coating processability of the coating composition and to decrease the trouble of striation. Particularly preferred are fluorine-containing surface active agents sold under various trade names such as Surflons SC-103 and SR-100 (each a product by Asahi Glass Co.), EF-351 (a product by Tohoku Hiryo Co.), Florads Fc-431, Fc-135, Fc-98, Fc-430 and Fc-176 (each a product by Sumitomo 3M Co.) and the like. The amount of the surface active agent added to the inventive undercoating composition, if added, should not exceed 2000 ppm by weight based on the overall amount of the non-volatile matter therein.

The undercoating composition of the invention is used, usually, in the form of a uniform solution which is prepared by dissolving the essential ingredients, i.e. components (A) and (B), and the optional ingredients described above in an organic solvent each in a specified concentration.

Examples of suitable organic solvents include ketones such as acetone, methyl ethyl ketone, cyclopentanone, cyclohexanone, methyl isoamyl ketone, 2-heptanone and 1,1,1-trimethyl acetone, polyhydric alcohols and derivatives thereof such as ethyleneglycol, ethyleneglycol monoacetate, diethyleneglycol, diethyleneglycol monoacetate, propyleneglycol and propyleneglycol monoacetate as well as monomethyl, monoethyl, monopropyl, monobutyl and monophenyl ethers thereof, cyclic ethers such as dioxane, esters such as ethyl lactate, methyl acetate, ethyl acetate, butyl acetate, methyl pyruvate, ethyl pyruvate, methyl 3-methoxypropionate and ethyl 3-ethoxypropionate, and so on. These organic solvents can be used either singly or as a mixture of two kinds or more according to need.

The resist material for photolithographic patterning according to the invention is an integral layered body consisting of a substrate such as a semiconductor silicon wafer, an undercoating layer formed on the surface of the substrate by using the above described inventive undercoating composition and a photoresist layer formed on the undercoating layer by using a photoresist composition sensitive to actinic rays for pattern-wise exposure. The photoresist composition to form the resist layer on the undercoating layer is not particularly limitative including positive-working and negative-working photoresist compositions provided that the resist layer thereof after patternwise exposure to actinic rays is developable with an aqueous alkaline developer solution. Examples of the positive-working photoresist composition include those containing a naphthoquinone diazide compound and a novolak resin, those containing a compound capable of generating an acid by exposure to actinic rays, a compound capable of being decomposed by an acid to be imparted with increased solubility in an aqueous alkaline solution and an alkali-soluble resin and those containing a compound capable of generating an acid by exposure to actinic rays and an alkali-soluble resin having a group capable of being decomposed by an acid to impart the resin with increased solubility in an aqueous alkaline solution while examples of the negative-working photoresist composition include those containing a compound capable of generating an acid by exposure to actinic rays, a crosslinking agent and an alkali-soluble resin, though not particularly limited to the photoresist compositions of these types.

The resist material for photolithographic patterning according to the invention is prepared, for example, in the following manner. In the first place, a substrate such as a semiconductor silicon wafer is coated with the inventive undercoating composition in the form of a solution in an organic solvent by using a suitable coating machine such as a spinner followed by a baking treatment at a temperature of 100 to 300° C. for at least 30 seconds to form an undercoating layer having a thickness of 0.05 to 0.3 μm. The baking treatment at the above mentioned temperature has an effect to cause a crosslinking reaction in the undercoating layer which is accordingly insolubilized in an aqueous alkaline solution and rendered less susceptible to the formation of an intermixing layer with the photoresist layer to be subsequently formed thereon. Thereafter, a photoresist layer having a thickness of 0.5 to 5 μm is formed on the thus obtained undercoating layer by coating with a photoresist composition on a spinner followed by a drying treatment.

In the following, a description is given for a typical procedure in the patterning of the inventive resist material for photolithographic patterning defined above. Thus, the photoresist layer at the top is exposed pattern-wise to actinic rays by irradiating with ultraviolet light, e.g., the g-line light, i-line light, deep ultraviolet light and excimer laser beams, through a pattern-bearing photomask to form a latent image of the pattern followed by a heat treatment. In the next place, the latent image is developed with an aqueous developer solution containing an organic alkali such as tetramethylammonium hydroxide and choline in a concentration of 2 to 10% by weight so that the resist layer is dissolved away in the exposed areas, when the photoresist composition is positive-working, or in the unexposed areas, when the photoresist composition is negative-working, to give a patterned resist layer having fidelity to the photomask pattern.

Thereafter, the undercoating layer is removed in the areas not covered by the patterned resist layer thereon by dry etching using chlorine gas and the like as the etching gas. It is conventional in order to increase the selectivity ratio in this etching between the resist layer and the undercoating layer that the patterned resist layer is, prior to dry etching, subjected to a silylating treatment, for example, by exposing the patterned resist layer to the vapor of a silylating agent such as hexamethyl disilazane, hexamethyl cyclotrisilazane, other polyfunctional silazane compounds and the like at a temperature of 30 to 100° C. for 1 to 60 minutes.

In the following, the undercoating composition of the present invention is described in more detail by way of Examples and Comparative Examples, which, however, never limit the scope of the invention in any way. The undercoating compositions prepared in the following Examples and Comparative Examples were evaluated for the items shown below by the testing procedures described there.

(1) Selectivity ratio

The selectivity ratio was recorded as the ratio of the etching rate of the undercoating layer to the etching rate of the patterned resist layer in the etching treatment performed under the etching conditions described in Example 1 below.

(2) Intermixing of layers

Electron microscopic examination was undertaken for a cross section of the resist material to record the results in two ratings of: A for the absence of any intermixing layer; and B for the occurrence of an intermixing layer between the undercoating layer and the photoresist layer.

(3) Notching

The resist material was subjected successively to pattern-wise exposure to light, in which the photomask had a line-and-space pattern of 0.40 μm line width, post-exposure baking, development and dry etching under the conditions described in Example 1 to effect patterning of the layers and a microscopic examination was undertaken for several straight lines of the patterned resist layer to record the results in two ratings of: A for no distortion of the straight lines; and B for noticeable distortion of the straight lines.

(4) Anti-reflective effect

The resist material was subjected successively to pattern-wise exposure to light, in which the photomask had a line-and-space pattern of 0.40 μm line width, post-exposure baking, development and dry etching under the conditions described in Example 1 to effect patterning of the layers and the ratio of the dimensional change of the resist pattern relative to the change in the thickness of the resist layer was determined. A smaller value of this ratio means a greater anti-reflective effect.

EXAMPLE 1

An undercoating composition in the form of a solution was prepared by dissolving 5 g of a methoxymethylated melamine of which the number of the methoxymethyl groups was 3.7 per melamine ring (Mx-750, supra), 3 g of 4,4'-bis(diethylamino) benzophenone and 5 g of 2,2',4,4'-tetrahydroxy benzophenone in 150 g of propyleneglycol monomethyl ether acetate followed by the addition of a fluorine-containing surface active agent (Fc-430, supra) in an amount of 1000 ppm by weight based on the overall amount of the composition excepting for the solvent and filtration of the solution through a membrane filter of 0.2 μm pore diameter.

A semiconductor silicon wafer was spin-coated with the above prepared undercoating solution followed by drying at 90° C. for 90 seconds and then a heat treatment at 180° C. for 5 minutes to form an undercoating layer having a thickness of about 0.10 μm. In the next place, the undercoating layer was spin-coated with a positive-working photoresist composition (TSMR-iP3300, a product by Tokyo Ohka Kogyo Co.), which is a solution containing a naphthoquinone diazide compound and a novolak resin, followed by drying at 90° C. for 90 seconds to form a photoresist layer having a thickness of 1.00 μm.

The photoresist layer of the above prepared resist material for photolithographic patterning was exposed pattern-wise to the i-line light through a pattern-bearing photomask on an exposure machine (Model NSR-2005i10D, manufactured by Nikon Co.) followed by a post-exposure baking treatment at 110° C. for 90 seconds and then subjected to a development treatment in a 2.38% by weight aqueous solution of tetramethylammonium hydroxide to give a patterned resist layer.

A dry etching treatment of the thus patterned resist material was undertaken on a plasma etching machine (Model TUE-1102, manufactured by Tokyo Ohka Kogyo Co.) of 150 watts output at 20° C. in an atmosphere of chlorine gas under a pressure of 30 mTorr. The results of the evaluation tests are shown in Table 1 below.

EXAMPLE 2

The procedures for the preparation of the undercoating composition and the evaluation tests were substantially the same as in Example 1 except that the undercoating solution prepared in Example 1 was further admixed with 1.3 g of a copolymer of glycidyl methacrylate and methyl methacrylate in a copolymerization ratio of 1:1 by weight having a weight-average molecular weight of 60,000 and the amount of the propyleneglycol monomethyl ether acetate was increased from 150 g to 190 g.

The results obtained in the evaluation tests are shown in Table 1.

EXAMPLE 3

The experimental procedures were substantially the same as in Example 1 except that the undercoating composition was prepared in the following formulation. Thus, an undercoating composition in the form of a solution was prepared by dissolving 5 g of a methoxymethylated melamine, of which the number of the methoxymethyl groups was 3.7 per melamine ring (Mx-750, supra), 3 g of 3-nitro-4-hydroxy-N-(4-diethylaminobenzylidene) aniline, 5 g of 2,2',4,4'-tetrahydroxy benzophenone and 1.3 g of a copolymer of glycidyl methacrylate and methyl methacrylate in a copolymerization ratio of 1:1 by weight having a weight-average molecular weight of 60,000 in 190 g of propyleneglycol monomethyl ether acetate followed by the addition of 1000 ppm by weight of a fluorine-containing surface active agent (Fc-430, supra) and filtration of the solution through a membrane filter of 0.2 μm pore diameter.

The evaluation tests of the resist material were undertaken in the same manner as in Example 1 to give the results shown in Table 1.

EXAMPLE 4

The experimental procedures were substantially the same as in Example 1 except that the undercoating composition was prepared in the following formulation. Thus, an undercoating composition in the form of a solution was prepared by dissolving 5 g of a methoxymethylated melamine, of which the number of the methoxymethyl groups was 3.7 per melamine ring (Mx-750, supra), 2 g of an azomethine compound expressed by the formula

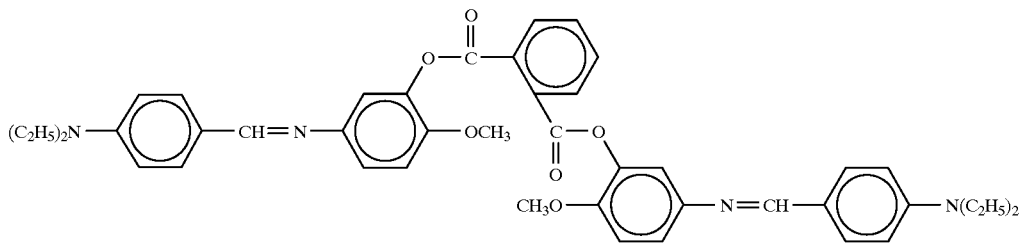

and 4 g of 2,2',4,4'-tetrahydroxy benzophenone in 127 g of propyleneglycol monomethyl ether acetate followed by the addition of 1000 ppm by weight of a fluorine-containing surface active agent (Fc-430, supra) and filtration of the solution through a membrane filter of 0.2 μm pore diameter.

The evaluation tests of the resist material were undertaken in the same manner as in Example 1 to give the results shown in Table 1.

Comparative Example

The experimental procedures were substantially the same as in Example 1 except that the undercoating composition was prepared in the following formulation. Thus, an undercoating composition in the form of a solution was prepared by dissolving 5 g of 2,2',4,4'-tetrahydroxy benzophenone, 9 g of a copolymer of glycidyl methacrylate and methyl methacrylate in a copolymerization ratio of 1:1 by weight having a weight-average molecular weight of 60,000 and 1000 ppm by weight of a fluorine-containing surface active agent (Fc-430, supra) in 200 g of propyleneglycol monomethyl ether acetate followed by filtration of the solution through a membrane filter of 0.2 μm pore diameter.

The evaluation tests of the resist material were undertaken in the same manner as in Example 1 to give the results shown in Table 1.

TABLE 1

|  | Selectivity ratio | Intermixing | Notching | Antireflective effect |
|---|---|---|---|---|
| Example 1 | 3.0 | A | A | 0.01 |
| Example 2 | 3.0 | A | A | 0.01 |
| Example 3 | 2.9 | A | A | 0.01 |
| Example 4 | 2.8 | A | A | 0.02 |
| Comparative Example | 2.45 | B | B | 0.04 |

What is claimed is:

1. An undercoating composition for photolithographic resist which comprises, as a uniform solution in an organic solvent:

(A1) an ultraviolet absorber which is a benzophenone compound having at least one amino group or alkyl-substituted amino group represented by the general formula

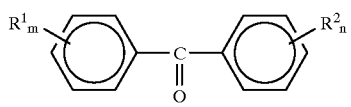

in which the subscripts m and n are, each independently from the other, 1 or 2 and $R^1$ and $R^2$ denote, each independently from the other, an amino group, alkyl-substituted amino group or hydroxyl group, at least one of the groups denoted by $R^1$ and $R^2$ in a molecule being an amino group or alkyl-substituted amino group; and (B) a crosslinking agent which is a nitrogen-containing organic compound having at least two groups selected from the group consisting of hydroxyalkyl groups and alkoxyalkyl groups in a molecule, in a weight proportion of the component (A1) to the component (B) in the range from 1:1 to 1:10, and which further comprises (C) 2,2',4,4'-tetrahydroxybenzophenone in an amount not exceeding 80% by weight based on the total amount of the components (A1) and (B).

2. The undercoating composition for photolithographic resist as claimed in claim 1 in which the alkyl-substituted amino group as $R^1$ or $R^2$ in the component (A1) is a dialkylamino group of which the alkyl group has 1 to 4 carbon atoms.

3. The undercoating composition for photolithographic resist as claimed in claim 1 in which the nitrogen-containing organic compound having at least two groups selected from the group consisting of hydroxyalkyl groups and alkoxyalkyl groups in a molecule as the component (B) is a melamine compound having at least two methylol groups or alkoxymethyl groups bonded to the nitrogen atoms in a molecule.

4. The undercoating composition for photolithographic resist as claimed in claim 3 in which the nitrogen-containing organic compound having at least two groups selected from the group consisting of hydroxyalkyl groups and alkoxyalkyl groups in a molecule as the component (B) is a melamine compound having at least three methylol groups or alkoxymethyl groups bonded to the nitrogen atoms in a molecule.

5. The undercoating composition for photolithographic resist as claimed in claim 1 in which the weight proportion of the component (A1) to the component (B) is in the range from 1:1 to 1:3.5.

6. The undercoating composition for photolithographic resist as claimed in claim 1 in which the benzophenone compound as the component (A1) is 4,4'-bis(diethylamino) benzophenone.

* * * * *